United States Patent [19]

Bonifield et al.

[11] Patent Number: 4,512,283

[45] Date of Patent: Apr. 23, 1985

[54] PLASMA REACTOR SIDEWALL SHIELD

[75] Inventors: Thomas D. Bonifield; Andrew J. Purdes, both of Garland, Tex.

[73] Assignee: Texas Instruments Incorporated, Dallas, Tex.

[21] Appl. No.: 549,341

[22] Filed: Nov. 4, 1983

Related U.S. Application Data

[63] Continuation of Ser. No. 344,586, Feb. 1, 1982, abandoned.

[51] Int. Cl.³ .............................................. C23C 13/08
[52] U.S. Cl. .................................. 118/723; 118/50.1; 118/728; 118/725; 156/345; 427/39
[58] Field of Search ............... 118/723, 725, 730, 728, 118/715, 50.1; 427/38, 39; 156/643, 345; 315/111.01

[56] References Cited

U.S. PATENT DOCUMENTS

| Re. 30,244 | 4/1980 | Alexander, Jr. et al. | 118/723 |
| 4,173,661 | 11/1979 | Bourdon | 427/39 |

FOREIGN PATENT DOCUMENTS 57-45927  3/1982  Japan .

Primary Examiner—John D. Smith
Assistant Examiner—Bernard F. Plantz
Attorney, Agent, or Firm—William E. Hiller; James T. Comfort; Melvin Sharp

[57] ABSTRACT

In a radial flow plasma reactor, where reagent gas is introduced into the reaction chamber of the plasma reactor via a gas distribution ring located on the perimeter of a heated substrate holder while diluent gas is introduced into the chamber via the holes in an annular diluent gas member disposed over an rf electrode, an upstanding peripheral shield is provided around the perimeter of the substrate holder, outboard of the reagent gas introduction ports of the gas distribution ring.

24 Claims, 5 Drawing Figures

PLASMA REACTOR SIDEWALL SHIELD

This is a continuation of application Ser. No. 344,586, filed Feb. 1, 1982, now abandoned.

BACKGROUND OF THE INVENTION

The present invention relates to a plasma reactor. Silicon nitride films are commonly deposited using radial flow, planar plasma reactors. In a typical reactor configuration, the active and diluent gases flow radially inward from the periphery to the center of the reactor. As these gases pass through the plasma discharge, a silicon nitride film is deposited on the bottom of the powered electrode and the top of the grounded plate which holds the substrates.

In order to improve physical properties of the nitride film, such as intrinsic stress and density, it is desirable to increase the rf power input to the discharge. This increase in the rf power (e.g. to 400 W) has previously required the development of a gas inlet system which prevents premature decomposition of the reactant gases. Even with this improved inlet system, however, the nitride deposition rate can be much higher near the periphery of the substrate plate than toward its center.

For most process conditions it has been found that the nitride deposition rate and film properties vary with radial position on the substrate plate. This is presumably due to depletion of the reagent gas concentration as the reagent gases pass through the plasma. For low rf power levels (e.g. less than 100 watts) it is often possible to adjust the gas flows and reactor pressure to achieve the nearly uniform deposition rate over the entire area of the substrate holder. However, radial nonuniformity becomes a greater problem as higher power levels are used.

Higher power levels are desirable not only for higher throughput, but also for better material characteristics in some processes, such as deposition of nitride films. U.S. patent application Ser. No. 344,590, filed Feb. 1, 1982, abandoned in favor of continuation application Ser. No. 549,217, filed Nov. 7, 1983, discloses a plasma reactor improvement which permits higher power levels to be used without causing excessive undesired deposition of material in unwanted areas of the reactor. However, the increase in rf power levels permitted by the above-cited application causes the material deposition rate to be somewhat higher near the periphery of the substrate holder than near its center. In particular, the pressure and flow characteristics which are found to give the most desirable material characteristics do not give good uniformity.

Thus, it is an object of the present invention to provide a method for plasma-assisted chemical vapor deposition at high rf power which provides good uniformity of deposited material over the entire substrate holder area.

SUMMARY OF THE INVENTION

To improve uniformity of deposition at high power levels, the present invention adds a metal sidewall shield, which is interposed between the glow discharge above the substrate holder and the grounded sidewalls of the reactor chamber. Uniformity of deposition rate, and of the stress within the material deposited, are greatly improved by the use of this shield.

According to the present invention, there is provided:

A plasma reactor comprising:
a substrate holder;
an electrode opposed to said substrate holder;
a reactor chamber comprising a plurality of walls enclosing said substrate holder and said electrode;
means for introducing reagent gases at the periphery of said substrate holder; and
a sidewall shield, said sidewall shield surrounding the periphery of said substrate holder and being spaced apart from said walls of said chamber.

BRIEF DESCRIPTION OF THE DRAWINGS

The present invention will be described with reference to the accompanying drawings, wherein.

DESCRIPTION OF THE PREFERRED EMBODIMENT

To overcome the nonuniformity problem the present invention teaches interposing a metal shield between the glow discharge and the grounded chamber sidewalls. The uniformity of the deposition rate and film stress are greatly improved with the use of this shield.

Figure 1:
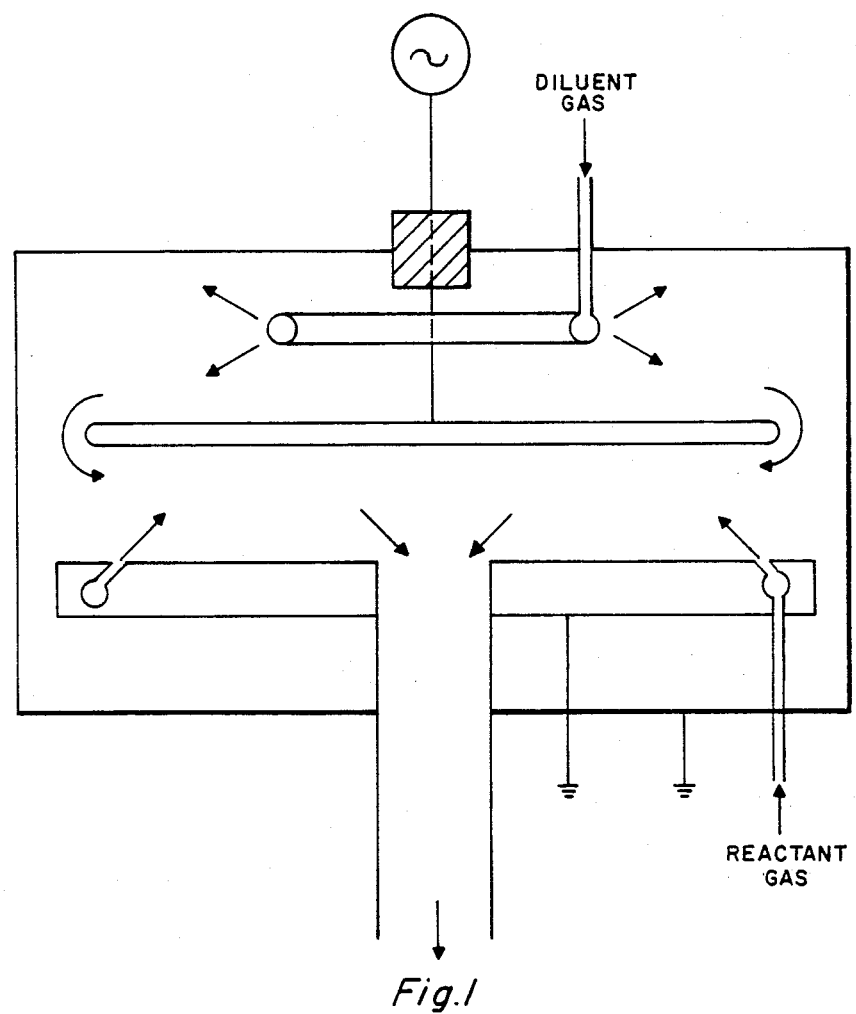
FIG. 1 shows an improved radial flow plasma reactor as disclosed and claimed in U.S. patent application Ser. No. 344,590, filed Feb. 1, 1982, abandoned in favor of continuation application Ser. No. 549,217, filed Nov. 7, 1983.

In the previously mentioned U.S. application Ser. No. 344,590, filed Feb. 1, 1982, abandoned in favor of continuation application Ser. No. 549,217, filed Nov. 7, 1983, which is hereby incorporated by reference, an improved method of introducing active and diluent gases which minimizes the formation of loose particulate matter on the internal top and sidewall surfaces of the reactor. A schematic of this reactor configuration is shown in FIG. 1. Although nitride films having improved physical properties and increased deposition rates are produced by use of the latter reactor, the uniformity of deposition rate across the substrate plate was still dependent upon deposition parameters such as gas flows and reactor pressure. Process conditions which produced the most desirable film properties did not give the best uniformity.

Although the gas flow scheme illustrated in FIG. 1 greatly decreased the generation of loose particulates, a 0.5 inch wide band of powder still formed on the reactor sidewall just above the substrate plate.

Figure 2:
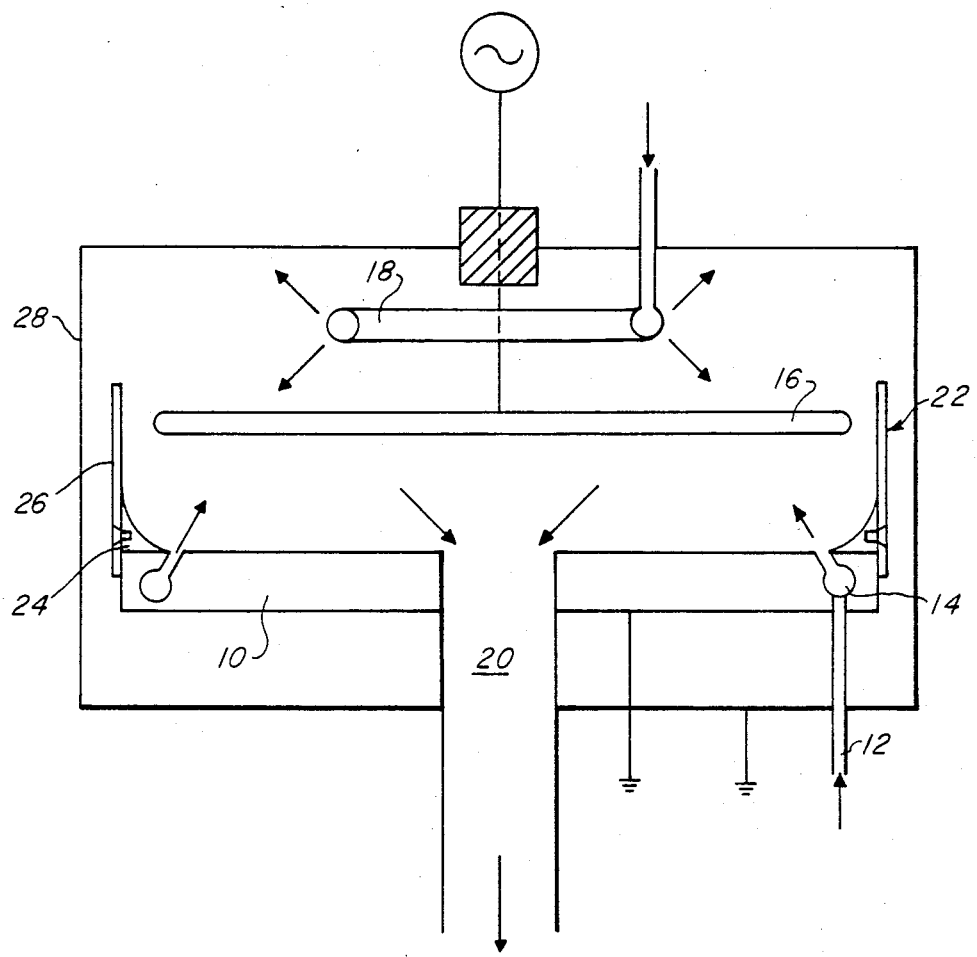
FIG. 2 shows the plasma reactor of the present invention, incorporating sidewall shields.

In the present invention, a metal shield is inserted on the periphery of the reactor (FIG. 2). The shield increases the physical and electrical isolation between the plasma and the reactor sidewall. This shield assembly reduces the backflow of reactant gases by providing a surface which preferably conforms with the laminar flow patterns and, since the shield is heated by contacting the hot (300° C.) substrate plate, a hard film is formed from those reactants which still manage to rech the shield surface.

With the sheet metal ring (26) either removed or adjusted to its full lower position (FIG. 3a), the uniformity of deposit across the substrate plate is only slightly improved from the situation without the ring. Upon raising the sheet metal ring (26) so that its upper edge was above the powered electrode (FIG. 3b), the uniformity of deposition rate and film stress are dramatically improved.

Table 1 lists the deposition rates and film stresses measured at three positions on the substrate plate for the two cases, without the shield and with the shield. Positions 1, 2 and 3 refer to inner, middle and outer radial positions respectively on the substrate plate. Without the shield, the deposition rate on the outer portion of the substrate plate is nearly twice that on the inner portion; the film stress is tensile on the outer portion and compressive on the inner portion. The use of the shield produces nitride deposits which are substantially more uniform in thickness and film stress over the entire area of the substrate plate.

In addition the use of the sidewall shield allows process variables such as gas flows and reactor pressure to be varied without losing uniformity. It is possible to adjust process conditions for optimal film properties without paying the previously encountered penalty of film nonuniformity.

The shield described above is also applicable to other plasma processes employing the plasma reactor, such as the deposition of silicon oxide and amorphous silicon. The shield can also be used in conjunction with plasma etching processes, since it improves the discharge uniformity.

In a plasma reactor containing a substrate holder 10, a reagent gas inlet 12, a reagent gas manifold 14 connected to the reagent gas inlet 12, an electrode 16 (e.g. of graphite), a diluent gas inlet 18, and an exhaust manifold 20, the present invention provides a sidewall shield 22, which achieves greater uniformity of deposition and a reduction in the amount of undesired deposition.

In the presently preferred embodiment, the sidewall shield 22 comprises a machined ring 24 having a concave inner side facing the electrode 16, and a sheet metal ring 26 attached to the concave ring 24. This configuration helps to achieve good laminar flow, which is desirable both to minimize transport of reagent gas to the sidewalls and to provide uniform deposition.

The presently preferred embodiment uses aluminum to fabricate the concave ring 24 and the sheet metal ring 26. The native oxide on the aluminum surface provides increased resistance, and the hard deposited nitride where the plasma comes closest to the sidewall shield 22 provides further surface resistance.

Although the effects of the sidewall shield in inducing laminar flow are desirable, the primary effect and primary advantage is in isolation of the plasma glow region between the substrate holder 10 and the electrode 16 from the cold chamber sidewalls 28. The shield provides physical isolation of the plasma from the cold sidewall. While strong deposition still occurs, it occurs primarily on the shield rather than on the cold chamber walls. Since the shield is hot (heated by contact with the substrate holder 10, which is at e.g. 300° C.), the film deposited on the shield will be hard (adherent) and therefore not as undesirable as are loose deposits. This provides an important advantage.

A further advantage of the sidewall shield is its effect on uniformity. Normally the rate of deposition at the outer perimeter edge of the substrate holder is higher, partly because the radial flow pattern of a radial-flow plasma reactor imposes higher gas velocity at the center, and therefore longer residence time for reagent gases near the periphery. Since the proximity of any solid object tends to deplete a plasma, the sidewall shield 22 depletes electrons from the active plasma near the periphery of substrate holder 10, and thereby reduces the deposition rate near the periphery of the substrate holder. Both the sidewall shield 22 and the substrate holder 10 may be constructed of aluminum which readily forms a surface oxide. The sidewall shield 22 is, as noted, partially insulated by native aluminum oxide, and therefore its electrical connection to the substrate holder 10 is poor. Thus, the sidewall shield 22 shows a significant series impedance to ground. Such a partially floating surface has two desirable effects: (1) the flow of rf current will be more uniform between the powered electrode 16 and the substrate holder 10, resulting in a more uniform plasma discharge; and (2) the grounded surface area in contact with the active plasma is reduced, so that the voltage drop between the active plasma and the substrate holder 10 is increased, resulting in a greater ion bombardment of the film being grown in the region atop the substrate holder 10.

Figure 3A:
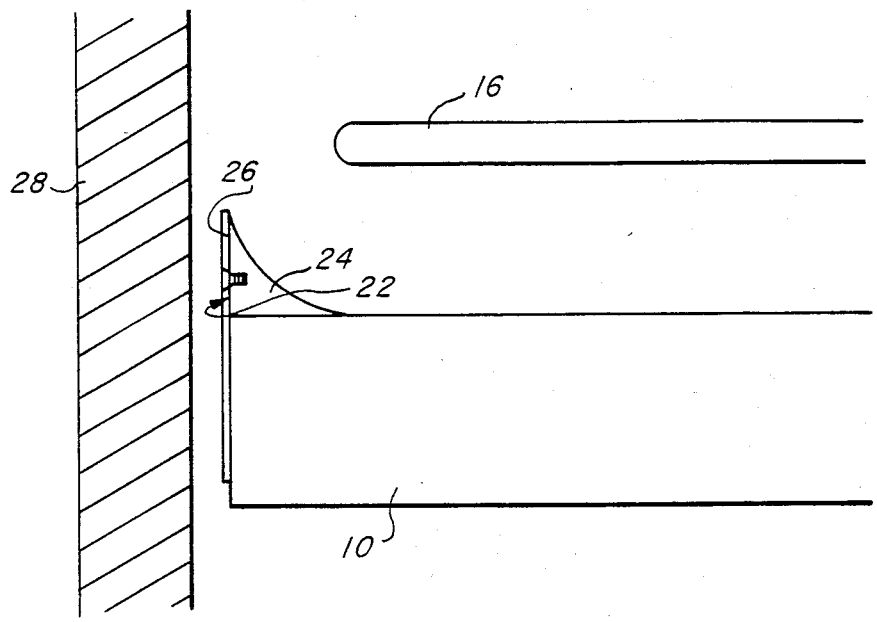
FIGS. 3a and 3b shown variations in sidewall shield dimensions and orientation which may be used in practicing the present invention.
Figure 3B:
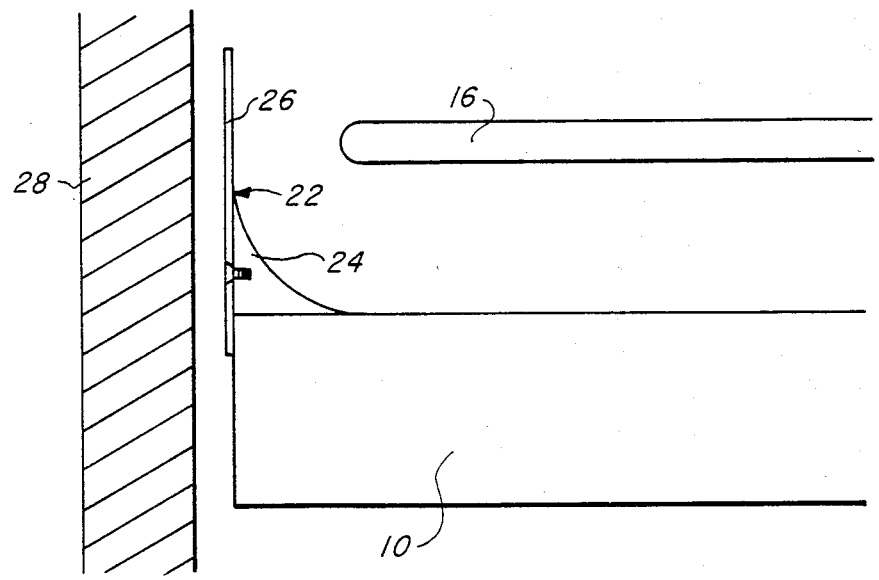

Two embodiments of the present invention are shown in FIGS. 3a and 3b. It has been found that the low shield of FIG. 3a gives a much smaller advantage than that of 3b. Nevertheless, FIG. 3a is also partially effective, and is also considered to be within the scope of the present invention. Alternately, of course, a wide variety of different geometric configurations for the sidewall shield 22 may be used, within the scope of the present invention. In particular, the sidewall shield need not include a concave ring 24 (although this is preferable), but may simply be a cylindrical hoop.

The results of a comparative test, evaluating a plasma reactor with and without a sidewall shield 22 according to the present invention (as shown in FIG. 3b), are shown on the following table.

TABLE 1

| PROCESS CONDITIONS | | | | |
|---|---|---|---|---|
| Flows: | | $SiH_4$ - 250 sccm | | |
| | | $NH_3$ - 400 sccm | | |
| | | $N_2$ - 1050 sccm | | |
| Pressure: | | 500μ | | |
| Power: | | 700 W | | |

| | NITRIDE FILM PROPERTIES | | | |
|---|---|---|---|---|
| | Without Shield | | With Shield | |
| Substrate Position | Dep. Rate (Å/min) | Film Stress (× 10⁹ dyne/cm²) | Dep. Rate (Å/min) | Film Stress (× 10⁹ dyne/cm²) |
| 1 | 570 | −4.9 | 590 | −3.4 |
| 2 | 620 | −2.6 | 620 | −5.2 |
| 3 | 1060 | +0.8 | 560 | −3.8 |

The process gases are preferably supplied at a sufficiently high pressure and flow rate that depletion has no significant effect.

Although the present invention has been discussed with primary reference to deposition of silicon nitride films, it is also applicable to the full scope of other plasma reactor processes, such as oxide deposition processes and etching processes.

In addition, while the advantages of a sidewall shield have been discussed with particular reference to the radial flow reactor using diluent gas boundary layers, this is not the only application of the present invention. For example, instead of using the reagent gas manifold 14, the reagent gas inlet 12 could alternately be positioned to open directly behind the substrate holder, near the center thereof. While such an embodiment might not afford the full advantages of the previously described embodiment of the present invention, it is also an application of the present invention, and is intended to be covered as within the scope thereof.

Figure 4:
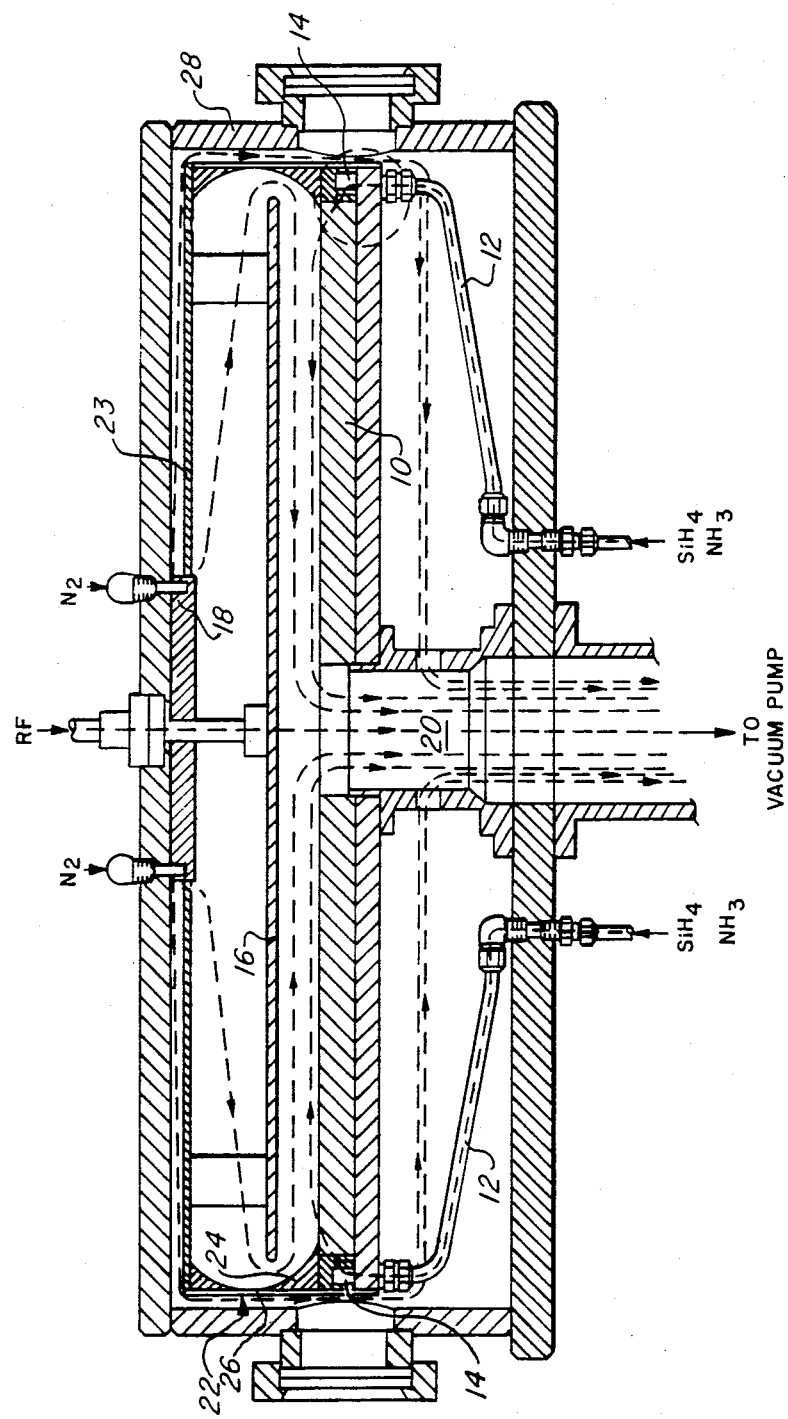
FIG. 4 shows a further embodiment of the plasma reactor.

The presently preferred embodiment of the invention is shown in FIG. 4. In this embodiment, the sidewall shield 22 is extended to connect to a roof shield 23. The roof shield 23 is heated by thermal conduction through sidewall shield 22 from substrate holder 10.

As will be understood by those skilled in the art, the present invention may be embodied in a wide scope of equivalents. In particular, the sidewall shield may be conductive or non-conductive, may or may not be curved to facilitate laminar flow, may or may not be electrically isolated from ground, and may or may not be extended to connect with a hot roof shield. The sidewall shield is optionally spaced away from the chamber walls by any distance which is large enough to provide thermal isolation, and spacing is optionally nonuniform. The height of the shield is optionally varied within a wide range. The chamber walls are optionally made of any stable material (preferably aluminum).

What is claimed is:

1. A plasma reactor comprising:
   a substrate holder;
   an electrode opposed to said substrate holder;
   a reactor chamber comprising a plurality of walls enclosing said substrate holder and said electrode;
   means for introducing reagent gases at the periphery of said substrate holder; and
   a sidewall shield, said sidewall shield surrounding, touching and in thermal contact with the periphery of said substrate holder and being spaced apart from said walls of said chamber.

2. The reactor of claim 1, wherein said sidewall shield is interposed between the periphery of said electrode and said walls of said chamber.

3. The reactor of claim 2, wherein said sidewall shield is physically attached to, but electrically insulated from, said substrate holder.

4. The reactor of claim 3, further comprising a reagent gas manifold at the periphery of said substrate holder within said sidewall shield, said reagent gas manifold being connected to said means for introducing reagent gases.

5. The reactor of claim 4, further comprising means for introducing a diluent gas, said diluent gas introducing means being positioned on the opposite side of said electrode from said substrate holder, and said means for introducing diluent gas being adapted to introduce said diluent gas at a location which is circumferentially symetric symmetric with respect to said substrate holder.

6. The reactor of claim 5, further comprising means for applying rf power to said electrode, said substrate holder and said chamber being grounded.

7. The reactor of claim 1, further comprising a roof shield, said roof shield being spaced apart from and parallel to said electrode and mechanically joined to said sidewall shield, said electrode being substantially interposed between said roof shield and said substrate holder.

8. The reactor of claim 7, further comprising means for introducing a diluent gas, said diluent gas introducing means being positioned to introduce diluent gas between said roof shield and said electrode.

9. The plasma reactor of claim 1, further comprising:
   means for applying rf power between said substrate holder and said electrode;
   a plasma discharge being generated between said substrate holder and said electrode, said substrate holder being heated, and said sidewall shield being also heated by thermal conduction in response to the application of said rf power between said substrate holder and said electrode.

10. The reactor of claim 7, wherein said sidewall shield is thermally conductive, whereby said roof shield is heated by heat conducted from said substrate holder through said sidewall shield.

11. The reactor of claim 1, further comprising a ring disposed around the periphery of said substrate holder and inwardly of said sidewall shield, said ring being mechanically connected to said substrate holder and to said sidewall shield.

12. The reactor of claim 11, wherein said ring has a concave inner side facing said electrode.

13. The reactor of claim 12, wherein said ring comprises aluminum.

14. The reactor of claim 1, wherein said sidewall shield comprises aluminum.

15. The reactor of claim 1, wherein said substrate holder comprises aluminum.

16. The reactor of claim 14, wherein said substrate holder comprises aluminum.

17. The reactor of claim 1, wherein said sidewall shield is physically attached to, but electrically insulated from, said substrate holder.

18. The reactor of claim 1, further comprising a reagent gas manifold at the periphery of said substrate holder within said sidewall shield, said reagent gas manifold being connected to said means for introducing reagent gases.

19. The reactor of claim 1, further comprising means for introducing a diluent gas, said diluent gas introducing means being positioned on the opposite side of said electrode from said substrate holder, and said means for introducing diluent gas being adapted to introduce said diluent gas at a location which is circumferentially symmetric with respect to said substrate holder.

20. The reactor of claim 1, further comprising means for applying rf power to said electrode, said substrate holder and said chamber being grounded.

21. The reactor of claim 11, wherein said sidewall shield extends upwardly with respect to said substrate holder and said ring and beyond the upper boundaries thereof.

22. The reactor of claim 21, wherein said sidewall shield is interposed between the periphery of said electrode and said walls of said chamber in respective spaced relationship therewith.

23. The reactor of claim 22, further including a roof shield, said roof shield being spaced apart from and parallel to said electrode and being fixedly connected to the upper end of said sidewall shield, and said electrode being substantially interposed between said roof shield and said substrate holder.

24. The reactor of claim 11, wherein said sidewall shield and said ring extend upwardly with respect to said substrate holder, and the upper boundaries of said sidewall shield and said ring being substantially coextensive.

* * * * *